United States Patent [19]

Tanaka et al.

[11] Patent Number: 5,151,408
[45] Date of Patent: Sep. 29, 1992

[54] PROCESS FOR PREPARING A-AXIS ORIENTED HIGH-TEMPERATURE SUPERCONDUCTING THIN FILMS

[75] Inventors: Saburo Tanaka; Hidenori Nakanishi; Hideo Itozaki, all of Hyogo, Japan

[73] Assignee: Sumitomo Electric Industries, Ltd., Osaka, Japan

[21] Appl. No.: 668,263

[22] Filed: Mar. 11, 1991

[30] Foreign Application Priority Data

Mar. 9, 1990 [JP] Japan .................................. 2-58512
Mar. 9, 1990 [JP] Japan .................................. 2-58513

[51] Int. Cl.$^5$ .............................................. B05D 5/12
[52] U.S. Cl. ...................................... 505/1; 505/731; 505/732; 427/62; 427/419.3; 427/419.2; 427/314; 204/192.24
[58] Field of Search ................... 505/1, 731, 732, 730; 427/62, 63, 419.3, 419.2, 314; 204/192.24

[56] References Cited

PUBLICATIONS

Eom et al, "Epitaxial and Smooth films of a-axis $YBa_2Cu_3O_7$" Science, vol. 249, Sep. 1990 pp. 1549-1552.
Shi et al, "Influence of substrate temperature on the orientation of $YBa_2Cu_3O_7$ films", Appl. Phys. Lett. 57(8) Aug. 1990 pp. 822-824.

Primary Examiner—Shrive Beck
Assistant Examiner—Roy V. King
Attorney, Agent, or Firm—Helfgott & Karas

[57] ABSTRACT

A process for preparing a-axis oriented thin film of oxide superconducting material on a substrate by two steps. In the first step, an under-layer of an oxide superconducting material is deposited on the substrate under such a condition that the substrate is heated at a temperature which is suitable to realize an a-axis orientation of crystal of the oxide superconducting material. In the second step, an upper-layer of the same oxide superconducting material is deposited on a surface of the resulting under-layer under such a condition that the substrate is heated at a temperature which is lowered by 10° to 100° C. than the temperature which is used in the first step.

12 Claims, 1 Drawing Sheet

2 UPPER-LAYER
1 UNDER-LAYER
3 SUBSTRATE

PROCESS FOR PREPARING A-AXIS ORIENTED HIGH-TEMPERATURE SUPERCONDUCTING THIN FILMS

BACKGROUND OF THE INVENTION

1. Field of the Invention

The present invention relates to a process for preparing a high-temperature superconducting thin film, more particularly to a process for preparing a high-temperature superconducting thin film possessing improved crystallinity and electrical properties on a substrate.

The high-temperature superconducting thin film means a thin film made of a new type oxide superconductor possessing the critical temperature (Tc) of higher than 30 K. such as Y-Ba-Cu oxide, Bi-Sr-Ca-Cu oxide, Ti-Ba-Ca-Cu oxide or the like.

2. Description of the Related Art

These new type high-temperature superconductors are expected to be utilized in actual uses. In order to fabricate electronics devices such as Josephson element, superconducting transistors or the like, it is indispensable to prepare thin films of these superconductors.

It is known that these high-temperature oxide superconductors show anisotropy in their superconducting properties. In fact, their crystals show higher critical current density (Jc) along a direction which is perpendicular to c-axis than the other directions. Therefore, a variety studies have been made to prepare c-axis oriented thin films of these oxide superconductors in order to flow a larger amount of electric current in parallel with a surface of the thin film, and now the c-axis oriented single crystal thin films of high quality can be prepared by sputtering, vacuum-evaporation, laser abrasion technique or the like on single crystal substrates such as $SrTiO_3$ and MgO.

These high-temperature superconductors exhibit anisotropy in their coherent length also. Namely, the coherent length along a-axis is longer than those along c-axis. In fact, the coherent length along c-axis is several angstroms (Å) while the coherent length along a-axis is several ten angstroms (10 Å). In certain application of oxide superconductors such as electronics devices, for example Josephson Junctions, the a-axis oriented thin films possessing such longer cherent length are requested. The "a-axis oriented thin film" means thin films made of crystal whose a-axis is substantially perpendicular to a surface of the thin film.

It is known that such a-axis oriented thin films of oxide superconductors can be prepared or realized, for example by sputtering, under such a condition that a substrate on which the thin film is deposited is heated at a temperature which is lower by about 10° C. than a temperature which is requested to realize the c-axis oriented thin film.

However, if the substrate temperature is lowered, the crystallinity of the resulting thin film of oxide superconductor is spoiled because oxygen supply into the crystal become insufficient. Therefore, the a-axis oriented thin films of oxide superconductors prepared by prior arts show relatively poor electrical properties.

In the case of the other technique than sputtering, it is difficult to prepare the a-axis oriented thin films of oxide superconductors even if the substrate temperature is controlled or lowered. Particularly, it is very difficult to prepare the a-axis oriented thin films of oxide superconductors by vacuum-evaporation. The vacuum-evaporation technique have such many merits that a composition in the thin film can be controlled easily and a thin film of large area can be prepared at relatively higher deposition rate. Therefore, there is very strong demand to establish a vacuum-evaporation technique which can prepare the a-axis oriented thin films of oxide superconductors of high quality.

An object of the present invention is to solve the problems and to provide a process for preparing the a-axis oriented thin films of oxide superconductors possessing improved electrical properties on a substrate.

Another object of the present invention is to provide a process which makes possible to prepare such a-axis oriented thin films of oxide superconductors by vacuum-evaporation technique.

SUMMARY OF THE INVENTION

The present invention provides a process for preparing the a-axis oriented thin films of oxide superconductors possessing improved crystallinity and electrical properties on a substrate.

The process according to the present invention comprises a first step of depositing an under-layer of the oxide superconducting material on a substrate under such a condition that the substrate is heated at a temperature which is suitable to realize an a-axis orientation of crystal of the oxide superconducting material, and a second step of deposition an upper-layer of the oxide superconducting material on a surface of the under-layer under such a condition that the substrate is heated at a temperature which is higher by 10° to 100° C. than the temperature which is used in the first step.

The "temperature which is suitable to realize an a-axis orientation of crystal of the oxide superconducting material" means a temperature at which the a-axis of crystals of which the thin film of the oxide superconducting material is made glow preferentially or predominantly in parallel with a surface of the substrate. Generally, such a-axis oriented thin films of oxide superconductors can be realized by physical vapour deposition technique such as sputtering under such a condition that a substrate on which the thin film is deposited is heated at a temperature which is lowered by about 10° C. than a temperature which is requested to realize the c-axis oriented thin film of the same material. For example, in the case that a-axis oriented thin films of Y-Ba-Cu-O type oxide superconductors are produced by sputtering, the substrate must be heated at a temperature between 530° and 620° C.

The under-layer according to the present invention can be prepared by any known technique and is preferably prepared by physical vapour deposition technique, particularly by sputtering. The term "sputtering" includes all variations thereof such as DC sputtering, RF sputtering, RF-magnetron sputtering or the like.

The under-layer has preferably a thickness of 20 to 1,000 Å. If the thickness is not thicker than 20 Å, it is difficult to obtain desired a-axis oriented upper-layer on the under-layer. Thicker thin film over 1,000 Å may not improve substantially the properties of the upper-layer.

In a preferred embodiment of the process according to the present invention, the upper-layer is produced by vacuum-evaporation method. In this case, a substrate having an under-layer which has been prepared by any technique can be heated at a temperature which is higher by 10° to 100° C. than a temperature which is used to prepare the under-layer. The substrate temperature for preparing the under-layer may be a temperature at which the c-axis oriented thin film usually glows.

The most important advantage of this embodiment of the present invention is that the a-axis oriented upper-layer of oxide superconducting material can be prepared by adopting a higher substrate temperature which corresponds to a temperature for realizing the c-axis oriented thin film and which has not been able to be used to prepare the a-axis oriented thin film. In other words, in the process according to the present invention, an upper-layer of a-axis oriented thin film can be grown on an under-layer which is also a-axis oriented thin film at an optimum substrate temperature which is an indispensable to supply sufficient amount of oxygen into crystals in order to prepare an oxide superconducting thin film possessing improved crystallinity and electrical properties on a substrate. This merit is obtained by such a fact that the upper-layer grows in a form of a-axis oriented thin film on an under-layer even if film formation is effected at a relatively higher substrate temperature, because crystal growth of the upper-layer is effected on a crystal structure of the under-layer which has been prepared in a form of an a-axis oriented thin film.

In the process according to the present invention, both of the under-layer and the upper-layer can be produced only by sputtering method.

The substrate is preferably a single crystal substrate of oxide such as MgO, $SrTiO_3$, $LaAlO_3$, $LaGaO_3$ and yttrium stabilized zirconia (YSZ).

The process according to the present invention can be used for preparing thin films of any high-temperature oxide material and is advantageously applicable to oxide superconducting materials of Y-Ba-Cu-O system and Bi-Sr-Ca-Cu-O system composition of which as well as their manufacturing processes are known.

The process according to the present invention has following merits:

(1) A-axis oriented thin films of high-temperature oxide superconductors can be prepared by vacuum-deposition method which have not been able to be used.

(2) The process according to the present invention can be carried out by changing simply the substrate temperature without modifying the conventional apparatus.

(3) The resulting thin films obtained by the process according to the present invention possess improved superconducting properties so that they can be utilized in practical uses in the field of electronics of high-temperature oxide superconductors.

DESCRIPTION OF THE PREFERRED EMBODIMENTS

Figure 1:
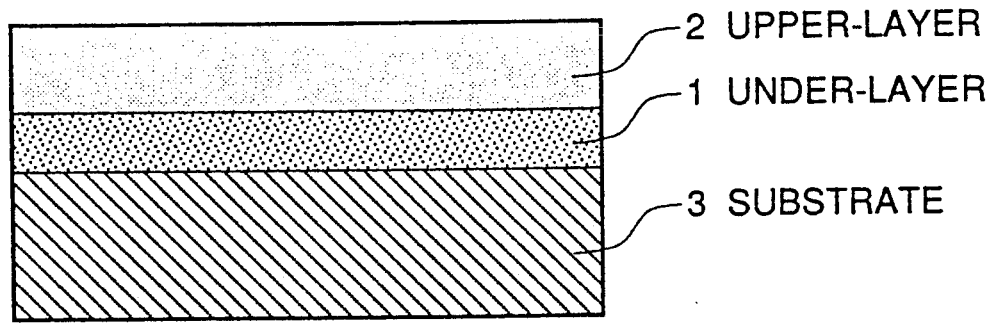
FIG. 1 which is unique drawing illustrates a diagrammatical cross section of a thin film of high-temperature oxide superconducting material which is prepared by the process according to the present invention and is deposited on a substrate.

Now, the present invention will be described with reference to examples, but the scope of the present invention should not be limited thereto.

A thin film of high-temperature oxide superconducting material which is illustrated in FIG. 1 and is prepared in following Example was prepared by depositing an under-layer 1 on a substrate 3 of (100) MgO single crystal by RF-magnetron sputtering and then by depositing an upper-layer 2 of the same high-temperature oxide superconducting material on the under-layer 1.

EXAMPLE 1

Sputtering/Vacuum Evaporation

In this Example, an under-layer of a-axis oriented thin film of Y-Ba-Cu-O oxide superconducting material was deposited on (100) MgO single crystal by RF-magnetron sputtering and then an upper-layer of the same Y-Ba-Cu-O oxide superconducting material was deposited thereon by vacuum-deposition.

In the RF-magnetron sputtering used for preparing the under-layer, a sintered oxide target having a composition of Y:Ba:Cu=1:2:3 was used. Operational conditions used for preparing the under-layer are summarized in Table 1.

TABLE 1

| Operational conditions for preparing under-layer of Y—Ba—Cu—O | |
|---|---|
| Substrate temperature | 620° C. |
| Sputtering gas (Ar + $O_2$) | $O_2$/(Ar + $O_2$) = 80 vol % |
| Gas pressure | 0.1 Torr |
| High-frequency power | 0.51 W/cm$^2$ |
| Deposition rate | 0.3 Å/sec |
| Film thickness | 100 Å |

Then, the resulting substrate having the under-layer of Y-Ba-Cu-O oxide superconducting material was passed to a vacuum-evaporation machine to deposit an upper-layer of the same Y-Ba-Cu-O oxide superconducting material by vacuum-evaporation method.

In the vacuum-evaporation used for preparing the upper-layer, metal elements of Y, Ba and Cu which are constituent components of the Y-Ba-Cu-O oxide superconducting material were simultaneously evaporated in a chamber in an oxygen gas flow. Amounts of elements evaporated were adjusted in such manner that atomic ratios of Y:Ba:Cu=1:2:3 were realized in the upper-layer. Operational conditions used for preparing the upper-layer are summarized in Table 2.

TABLE 2

| Operational conditions for preparing upper-layer of Y—Ba—Cu—O | |
|---|---|
| Substrate temperature | 640° C. |
| Total gas pressure | 5 × 10$^{-4}$ Torr |
| Flow rate of $O_2$ gas | 30 s.c.c.m. |
| High-frequency power | 200 W |
| Deposition rate | 4 Å/sec |
| Film thickness | 3,000 Å |

Electrodes were connected to a surface of the resulting upper-layer to determine the critical temperature (Tc) by usual method. The critical temperature (Tc) was 89K.

Crystallinity of the resulting upper-layer prepared by the present invention was analyzed by a reflective high energy electron diffraction (RHEED) analyzer to find that a long distance structure of the c-axis direction appeared in a direction which is perpendicular to an incident beam. This fact reveals that the resulting upper-layer is an a-axis oriented thin film.

EXAMPLE 2

Sputtering/Vacuum Evaporation

Example 1 was repeated, but the Y-Ba-Cu-O target was changed to a sintered oxide target having a composition of Bi:Sr:Ca:Cu=2:2:2:3. Operational conditions used for preparing the under-layer are summarized in Table 3.

TABLE 3

| Operational conditions for preparing under-layer of Bi—Sr—Ca—Cu—O | |
|---|---|
| Substrate temperature | 620° C. |
| Sputtering gas (Ar + O₂) | O₂/(Ar + O₂) = 80 vol % |
| Gas pressure | 0.1 Torr |
| High-frequency power | 0.51 W/cm² |
| Deposition rate | 0.3 Å/sec |
| Film thickness | 100 Å |

Then, the resulting substrate having the under-layer of Bi-Sr-Ca-Cu-O oxide superconducting material was passed to a vacuum-evaporation machine to deposit an upper-layer of the same Bi-Sr-Ca-Cu-O oxide superconducting material by vacuum-evaporation method.

In the vacuum-evaporation used for preparing the upper-layer, metal elements of Bi, Sr, Ca and Cu which are constituent components of the Bi-Sr-Ca-Cu-O oxide superconducting material were simultaneously evaporated in a chamber in an oxygen gas flow. Amounts of elements evaporated were adjusted in such manner that atomic ratios of Bi:Sr:Ca: Cu=2:2:2:3 were realized in the upper-layer. Operational conditions used for preparing the upper-layer are summarized in Table 4.

TABLE 4

| Operational conditions for preparing upper-layer of Bi—Sr—Ca—Cu—O | |
|---|---|
| Substrate temperature | 640° C. |
| Total gas pressure | 5 × 10⁻⁴ Torr |
| Flow rate of O₂ gas | 30 s.c.c.m. |
| High-frequency power | 200 W |
| Deposition rate | 4 Å/sec |
| Film thickness | 3,200 Å |

The critical temperature (Tc) determined by the same method as Example 1 was 101K.

In this Example also, a long distance structure of the c-axis direction determined by the RHEED analyzer was appeared in a direction which is perpendicular to an incident beam.

EXAMPLE 3

Sputtering/Sputtering

In this Example, both of under-layer and upper-layer were prepared by RF-magnetron sputtering. Namely, an a-axis oriented thin film of oxide superconducting material was prepared on a substrate by two steps. In the first step, an under-layer of Y-Ba-Cu-O oxide superconducting material was deposited firstly under such a condition that a substrate on which the under-layer to be deposited was heated at a temperature which was suitable to realize a-axis orientation of crystal of the oxide superconducting material. In the second step, an upper-layer of the same Y-Ba-Cu-O oxide superconducting material was deposited on a surface of the resulting under-layer under such a condition that the substrate was heated at a temperature which was higher by 10° to 100° C. than the temperature which was used in the first step. In this Example, both of the under-layer and the upper-layer were prepared in one chamber successively.

In the RF-magnetron sputtering used for preparing the two layers, a sintered oxide target having a composition of Y:Ba:Cu=1:2:3 was used. Operational conditions used for preparing two layers of the under-layer and the upper-layer are summarized in Table 5.

TABLE 5

| Operational conditions for preparing under-layer and upper-layer of Y—Ba—Cu—O | | |
|---|---|---|
| Operational conditions | under-layer | upper-layer |
| Substrate temperature (°C.) | 620 | 640 |
| Sputtering gas (Ar + O₂) O₂/(Ar + O₂) (vol %) | 80 | 80 |
| Gas pressure (Torr) | 0.1 | 0.1 |
| High-frequency power (W/cm²) | 0.51 | 0.51 |
| Deposition rate (Å/sec) | 0.3 | 0.3 |
| Film thickness (Å) | 100 | 4,000 |

The critical temperature (Tc) determined by usual method is summarized in Table 6.

Crystallinity of the resulting upper-layer prepared by the present invention was analyzed by a reflective high energy electron diffraction (RHEED) analyzer to find that a long distance structure of the c-axis direction appeared in a direction which is perpendicular to an incident beam. This fact reveals that the resulting upper-layer is an a-axis oriented thin film.

COMPARATIVE EXAMPLE 1

A thin film having a total thickness which corresponds a thickness of the under-layer plus the thickness of the upper-layer of Example 3 was prepared under the same conditions that were used for preparing the under-layer in Example 3. Namely, the substrate temperature was maintained at a constant value of 620° C. during deposition of two layers of the under-layer and the upper-layer.

The critical temperature (Tc) determined on the resulting thin film is summarized in Table 6.

TABLE 6

|  | Tc |
|---|---|
| Example 3 | 90 |
| Comparative Example 1 | 80 |

EXAMPLE 4

Sputtering/Sputtering

Example 3 was repeated, but the Y-Ba-Cu-O target was changed to a sintered oxide target having a composition of Bi Sr:Ca:Cu=2:2:2:3. Operational conditions used for preparing two layers of the under-layer and the upper-layer are summarized in Table 7.

TABLE 7

| Operational conditions for preparing under-layer and upper-layer of Bi—Sr—Ca—Cu—O | | |
|---|---|---|
| Operational conditions | under-layer | upper-layer |
| Substrate temperature (°C.) | 620 | 680 |
| Sputtering gas (Ar + O₂) O₂/(Ar + O₂) (vol %) | 80 | 80 |
| Gas pressure (Torr) | 0.1 | 0.1 |
| High-frequency power (W/cm²) | 0.51 | 0.51 |
| Deposition rate (Å/sec) | 0.3 | 0.3 |
| Film thickness (Å) | 100 | 4,000 |

The critical temperature (Tc) determined by usual method is summarized in Table 8.

Crystallinity of the resulting upper-layer prepared by the present invention was analyzed by a reflective high energy electron diffraction (RHEED) analyzer to find that a long distance structure of the c-axis direction appeared in a direction which is perpendicular to an incident beam. This fact reveals that the resulting upper-layer is an a-axis oriented thin film.

COMPARATIVE EXAMPLE 2

A thin film having a total thickness which corresponds a thickness of the under-layer plus the thickness of the upper-layer in Example 4 was prepared under the same conditions that were used for preparing the under-layer in Example 4. Namely, the substrate temperature was maintained at a constant value of 620° C. during deposition of two layers of the under-layer and the upper-layer.

The critical temperature (Tc) determined on the resulting thin film is summarized in Table 8.

TABLE 8

|  | Tc |
|---|---|
| Example 3 | 102 |
| Comparative Example 1 | 80 |

The results of these Examples reveal that the thin films of high-temperature oxide superconductors prepared by the process according to the present invention possess improved superconducting properties comparing to those prepared by the conventional process.

What is claimed is:

1. A process for preparing a-axis oriented thin film of oxide superconducting material, characterized by the steps of:

depositing an under-layer of said oxide superconducting material on a substrate under such a condition that said substrate is heated at a temperature which is suitable to realize an a-axis orientation of crystal of said oxide superconducting material, and then depositing an upper-layer of said oxide superconducting material on a surface of said under-layer under such a condition that said substrate is heated at a temperature which is higher by 10° to 100° C. than said temperature which is used in the first depositing step, wherein said under-layer is deposited up to a thickness of 20 to 1,000 A.

2. The process set forth in claim 1 wherein said upper-layer is produced by vacuum-evaporation method.

3. The process set forth in claim 2 wherein said under-layer is produced by sputtering method.

4. The process set forth in claim 3 wherein said sputtering method is RF sputtering.

5. The process set forth in claim 4 wherein said substrate is a single crystal substrate of oxide.

6. The process set forth in claim 5 wherein said substrate is a single crystal substrate of oxide selected from the group consisting of MgO, SrTiO$_3$, LaAlO$_3$, LaGaO$_3$ and yttrium stabilized zirconia (YSZ).

7. The process set forth in claim 6 wherein said oxide superconducting material is Y-Ba-Cu-O oxides or Bi-Sr-Ca-Cu-O oxides.

8. The process set forth in claim 1 wherein both of said under-layer and upper-layer are produced by sputtering method.

9. The process set forth in claim 8 wherein said sputtering method is RF sputtering.

10. The process set forth in claim 9 wherein said substrate is a single crystal substrate of oxide.

11. The process set forth in claim 10 wherein said substrate is a single crystal substrate of oxide selected from the group consisting of MgO, SrTiO$_3$, LaAlO$_3$, LaGaO$_3$ and yttrium stabilized zirconia (YSZ).

12. The process set forth in claim 11 wherein said oxide superconducting material is Y-Ba-Cu-O oxides or Bi-Sr-Ca-Cu-O oxides.

* * * * *